United States Patent
Steedman et al.

(10) Patent No.: US 9,310,828 B2
(45) Date of Patent: Apr. 12, 2016

(54) COMPLEMENTARY OUTPUT GENERATOR MODULE

(71) Applicant: Microchip Technology Incorporated, Chandler, AZ (US)

(72) Inventors: Sean Stacy Steedman, Phoenix, AZ (US); Zeke Lundstrum, Chandler, AZ (US); Cristian Nicolae Groza, Pascani (RO); Sebastian Dan Copacian, Menumorut (RO); Hartono DArmawaskita, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 330 days.

(21) Appl. No.: 14/080,322

(22) Filed: Nov. 14, 2013

(65) Prior Publication Data

US 2014/0136876 A1    May 15, 2014

Related U.S. Application Data

(60) Provisional application No. 61/726,996, filed on Nov. 15, 2012.

(51) Int. Cl.
*G06F 1/06* (2006.01)
*G06F 1/12* (2006.01)
(Continued)

(52) U.S. Cl.
CPC .. *G06F 1/06* (2013.01); *H03K 5/05* (2013.01); *H03K 5/1515* (2013.01); *H03K 7/08* (2013.01); *G06F 12/00* (2013.01); *G06F 13/1694* (2013.01); *H03L 7/089* (2013.01); *H03L 7/10* (2013.01)

(58) Field of Classification Search
CPC ....... G06F 1/06; G06F 12/00; G06F 13/1694; H03L 7/089; H03L 7/10
USPC .......... 713/500, 501, 600; 327/170, 258, 293, 327/363
See application file for complete search history.

(56) References Cited

U.S. PATENT DOCUMENTS

| 5,867,046 | A | * | 2/1999 | Sugasawa | ............ | H03K 5/1515 |
| | | | | | | 326/93 |
| 6,577,167 | B1 | * | 6/2003 | Soda | ...................... | H04L 7/0338 |
| | | | | | | 327/291 |

(Continued)

FOREIGN PATENT DOCUMENTS

JP    2005143282 A    6/2005    ............ H02M 3/155

OTHER PUBLICATIONS

International Search Report and Written Opinion, Application No. PCT/US2013/070249, 12 pages, Feb. 7, 2014.

*Primary Examiner* — Michael J Brown
(74) *Attorney, Agent, or Firm* — Slayden Grubert Beard PLLC

(57) ABSTRACT

A complementary output generator (COG) module generates at least two complementary outputs determined by rising and falling event sources. In a simple configuration of the COG module, the rising and falling event sources are the same signal which is a signal having the desired period and duty cycle. The COG module converts this single signal input into dual complementary outputs. The frequency and duty cycle of the dual outputs substantially match those of the single input signal. Blanking and deadband times may be introduced between the complementary outputs, and the dual complementary outputs may also be phase delayed. In addition the COG module may provide up to four outputs for controlling half and full-wave bridge power applications.

35 Claims, 12 Drawing Sheets

(51) Int. Cl.
*H03K 5/05* (2006.01)
*H03K 5/151* (2006.01)
*H03K 7/08* (2006.01)
*G06F 12/00* (2006.01)
*G06F 13/16* (2006.01)
*H03L 7/089* (2006.01)
*H03L 7/10* (2006.01)

(56) References Cited

U.S. PATENT DOCUMENTS

| | | | |
|---|---|---|---|
| 7,804,379 B2 | 9/2010 | Kris et al. | 332/109 |
| 8,487,685 B2 | 7/2013 | Steedman et al. | 327/293 |
| 2002/0184469 A1 | 12/2002 | Bowling | 712/1 |
| 2009/0278621 A1 | 11/2009 | Kris et al. | 332/109 |

* cited by examiner

COMPLEMENTARY OUTPUT GENERATOR MODULE

RELATED PATENT APPLICATION

This application claims priority to commonly owned U.S. Provisional Patent Application Ser. No. 61/726,996; filed Nov. 15, 2012; entitled "Complementary Output Generator Module," by Sean Stacy Steedman, Zeke Lundstrum, Cristian Nicolae Groza, Sebastian Dan Copacian and Hartono Darmawaskita; and is hereby incorporated by reference herein for all purposes.

TECHNICAL FIELD

The present disclosure relates to a complementary output generator (COG) module, and in particular, a COG module for use with a microcontroller in combination with other modules, such as, for example but not limited to, a pulse width modulator peripheral module that may be used in power management, e.g., a switched-mode power supply (SMPS), battery charger, motor speed, energy harvesting, etc.

BACKGROUND

Complementary output generator (COG) modules are used in combination with a variety of signal generation modules, e.g., pulse width modulators, comparators, frequency generators, etc., in microcontrollers and other digital control devices. Programmability of such a peripheral device allows many different applications, for example to control power transistors in a bridge configuration or switched-mode power supply (SMPS). While many configurations are available with conventional complimentary output generators, there still exists a need for improved functionality of such a COG module.

SUMMARY

Therefore, a need exists for a COG module having enhanced features as more fully described hereinafter.

According to an embodiment, a complementary output generator module for a microcontroller, wherein the complimentary output generator may be configurable through a processing core of the microcontroller may comprise: a clock input coupled to a clock source; a plurality of rising event inputs that may be programmably selectable, wherein at least one of the selected rising event inputs initiates a rising event signal synchronous with the clock source when at least one rising event occurs at a respective selected one of the rising event inputs; a plurality of falling event inputs that may be programmably selectable, wherein at least one of the selected falling event inputs initiates a falling event signal synchronous with the clock source when at least one falling event occurs at a respective selected one of the falling event inputs; and a plurality of outputs, wherein a first one of the plurality of outputs asserts a first output drive signal upon detection of the rising event signal until detection of the falling event signal, and a second one of the plurality of outputs asserts a second output drive signal upon detection of the falling event signal until detection of a next rising event signal.

According to a further embodiment, a clock multiplexer may be coupled between the clock input and a plurality of clock sources, wherein the clock multiplexer may be adapted to select a one of the plurality of clock sources. According to a further embodiment, a rising event blanking time circuit may be provided for inhibiting the rising event from generating the rising event signal until after the rising event blanking time circuit has timed out. According to a further embodiment, the rising event blanking time circuit may comprise: a counter coupled to the clock source; a comparator coupled to the counter; and a blanking time register coupled to the comparator.

According to a further embodiment, the rising event blanking time circuit may comprise: a plurality of series connected unit delay elements; and a multiplexer having inputs coupled to respective ones of the plurality of series connected unit delay elements. According to a further embodiment, a falling event blanking time circuit may be provided for inhibiting the falling event from generating the falling event signal until after the falling event blanking time circuit has timed out. According to a further embodiment, the falling event blanking time circuit may comprise: a counter coupled to the clock source; a comparator coupled to the counter; and a blanking time register coupled to the comparator. According to a further embodiment, the falling event blanking time circuit may comprise: a plurality of series connected unit delay elements; and a multiplexer having inputs coupled to respective ones of the plurality of series connected unit delay elements.

According to a further embodiment, a rising event deadband time circuit may be provided for inhibiting the second output drive signal until after the rising event deadband time circuit has timed out. According to a further embodiment, the rising event deadband time circuit may comprise: a counter coupled to the clock source; a comparator coupled to the counter; and a deadband time register coupled to the comparator.

According to a further embodiment, the rising event deadband time circuit may comprise: a plurality of series connected unit time delay elements; and a multiplexer having inputs coupled to respective ones of the plurality of series connected unit delay elements. According to a further embodiment, each unit time delay element provides a fixed time delay. According to a further embodiment, the fixed time delay may be about five nanoseconds.

According to a further embodiment, a falling event deadband time circuit may be provided for inhibiting the first output drive signal until after the falling event deadband time circuit has timed out. According to a further embodiment, the falling event deadband time circuit may comprise: a counter coupled to the clock source; a comparator coupled to the counter; and a deadband time register coupled to the comparator. According to a further embodiment, the falling event deadband time circuit may comprise: a plurality of series connected unit time delay elements; and a multiplexer having inputs coupled to respective ones of the plurality of series connected unit delay elements. According to a further embodiment, each unit time delay element provides a fixed time delay.

According to a further embodiment, a plurality of output polarity reversing circuits may be provided, wherein each one of the plurality of output polarity reversing circuits may be coupled to a respective one of the plurality of outputs, whereby when a first logic level may be applied to the output polarity reversing circuits the respective ones of the plurality of outputs provide a non-inverted output drive signal and when a second logic level may be applied to the output polarity reversing circuits the respective ones of the plurality of outputs provide an inverted output drive signal.

According to a further embodiment, a plurality of output steering multiplexers may be provided, wherein the plurality of output steering multiplexers couples respective ones of the plurality of outputs to either a respective signal, a logic high, a logic low, or a high impedance. According to a further embodiment, the plurality of output steering multiplexers changes coupling of signals to the plurality of outputs substantially immediately. According to a further embodiment, the plurality of output steering multiplexers changes coupling of signals to the plurality of outputs in synchronization with a next rising event signal.

According to a further embodiment, a pulse width modulation (PWM) generator having an output coupled to the rising and falling event inputs may be provided. According to a further embodiment, the complementary output generator module may be configured in a half-bridge mode. According to a further embodiment, the complementary output generator module may be configured in a push-pull mode. According to a further embodiment, the complementary output generator module may be configured in a forward full-bridge mode. According to a further embodiment, the complementary output generator module may be configured in a reverse full-bridge mode. According to a further embodiment, the complementary output generator module may be configured in a steering mode. According to a further embodiment, the complementary output generator module may be configured in a synchronous steering mode.

According to another embodiment, a method for generating complementary waveforms may comprise the steps of: selecting at least one rising event source from a plurality of rising event sources; providing for blanking of subsequent at least one falling event within a programmable rising event blanking time period; selecting between detection of rising event source edges or rising event source voltage levels for generating a rising event signal; selecting at least one falling event source from a plurality of falling event sources; providing for blanking of subsequent at least one rising event within a programmable falling event blanking time period; selecting between detection of falling event source edges or falling event source voltage levels for generating a falling event signal; asserting at least one first output upon detection of the at least one rising event until detection of the at least one falling event; and asserting at least one second output upon detection of the at least one falling event until detection of a next at least one rising event.

According to a further embodiment of the method, the step of providing for a rising event phase delay may be provided, wherein the rising event phase delay delays the rising event signal. According to a further embodiment of the method, the step of providing a falling event phase delay may be provided, wherein the falling event phase delay delays the falling event signal. According to a further embodiment of the method, the step of providing a deadband time may be provided between the steps of asserting the first output and asserting the second output. According to a further embodiment of the method, the step of providing the deadband time may comprise the step of delaying assertion of the first output after the step of de-asserting the second output. According to a further embodiment of the method, the step of providing the deadband time may comprise the step of delaying assertion of the second output after the step of de-asserting the first output. According to a further embodiment of the method, the step of forcing all of the outputs to predefined logic levels upon assertion of an auto-shutdown may be provided.

BRIEF DESCRIPTION OF THE DRAWINGS

A more complete understanding of the present disclosure may be acquired by referring to the following description taken in conjunction with the accompanying drawings wherein.

Figure 1:
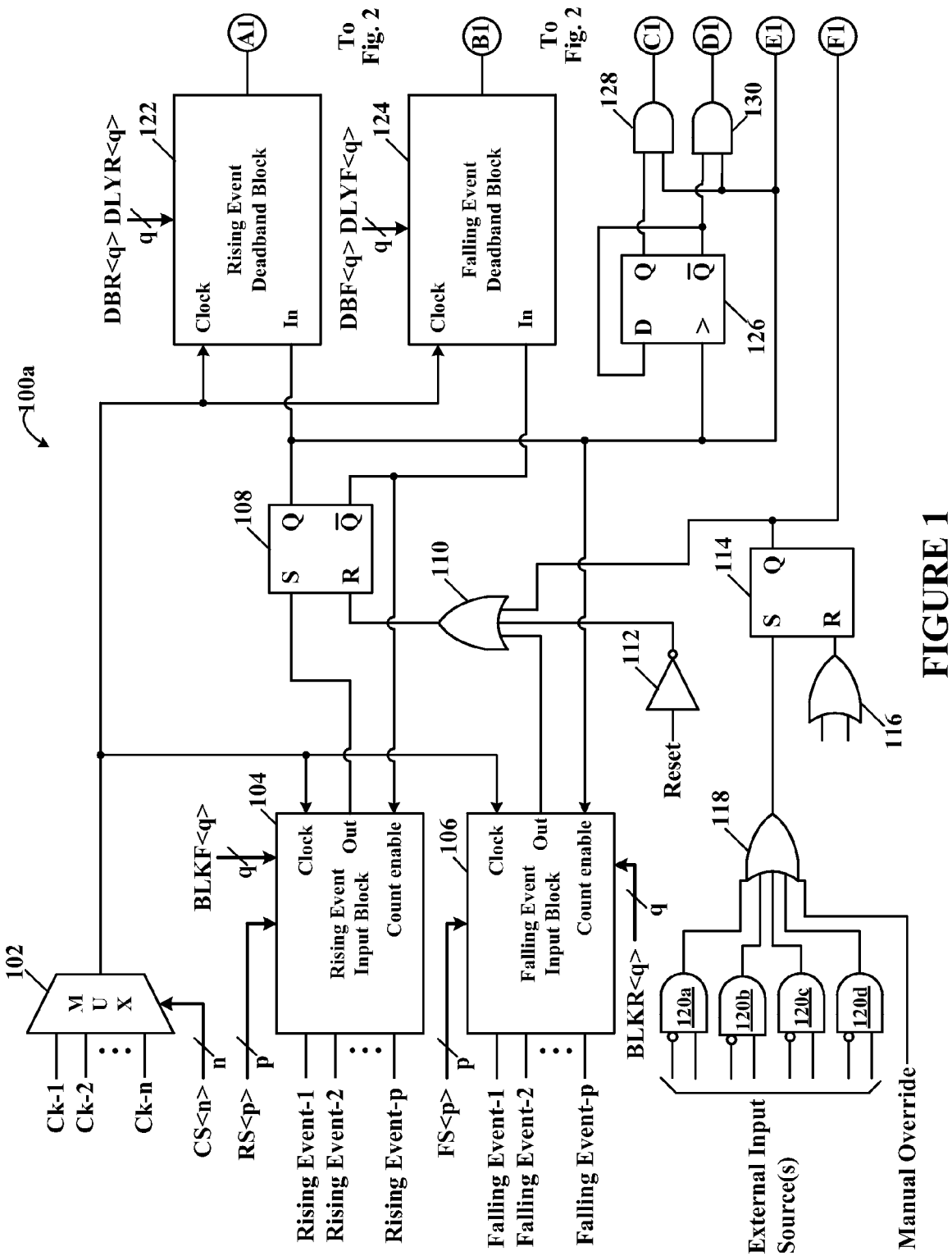
FIGS. 1 and 2 illustrate a schematic block diagram of a software configurable complementary output generator module, according to a specific example embodiment of this disclosure.
Figure 2:
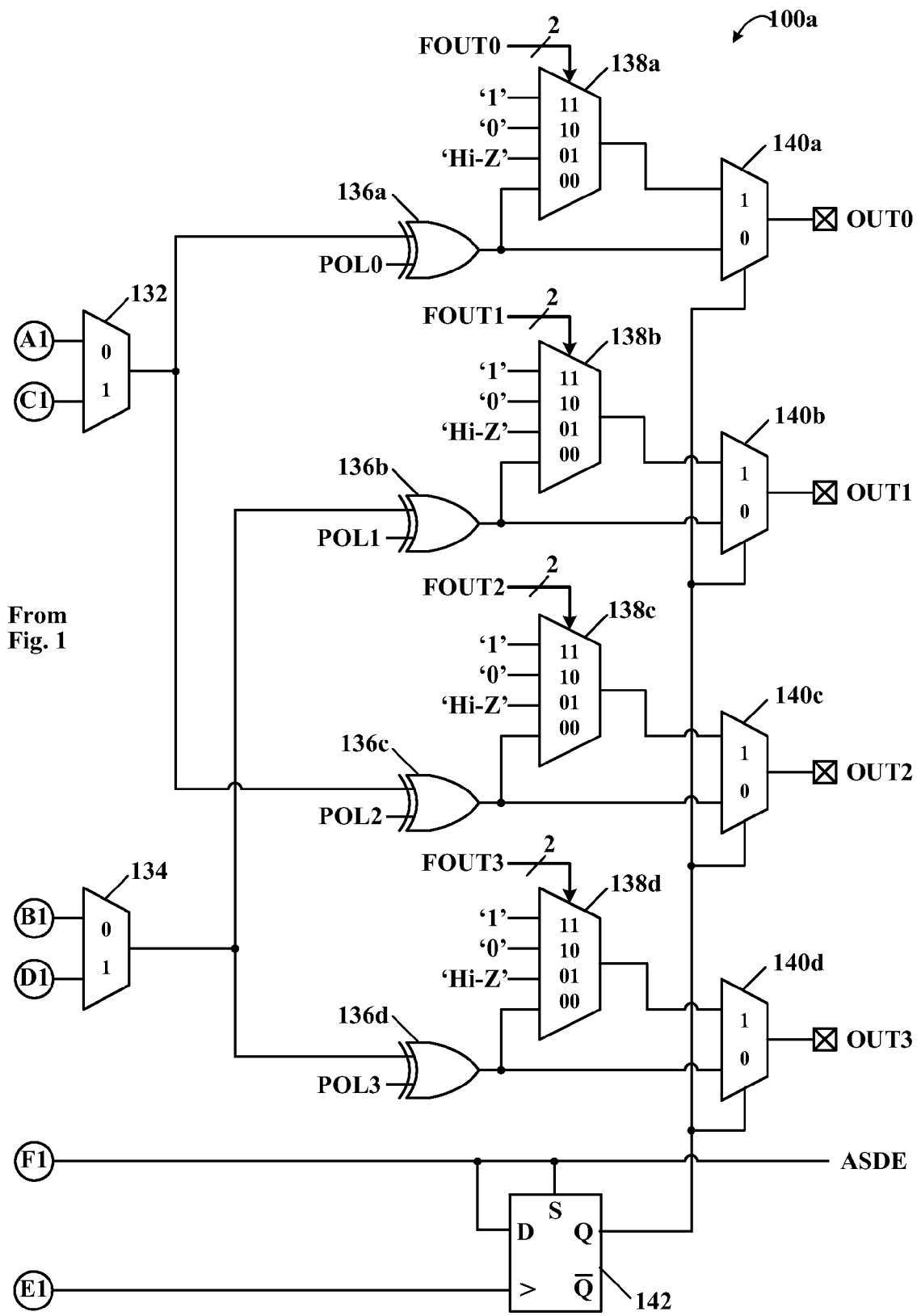
Figure 3:
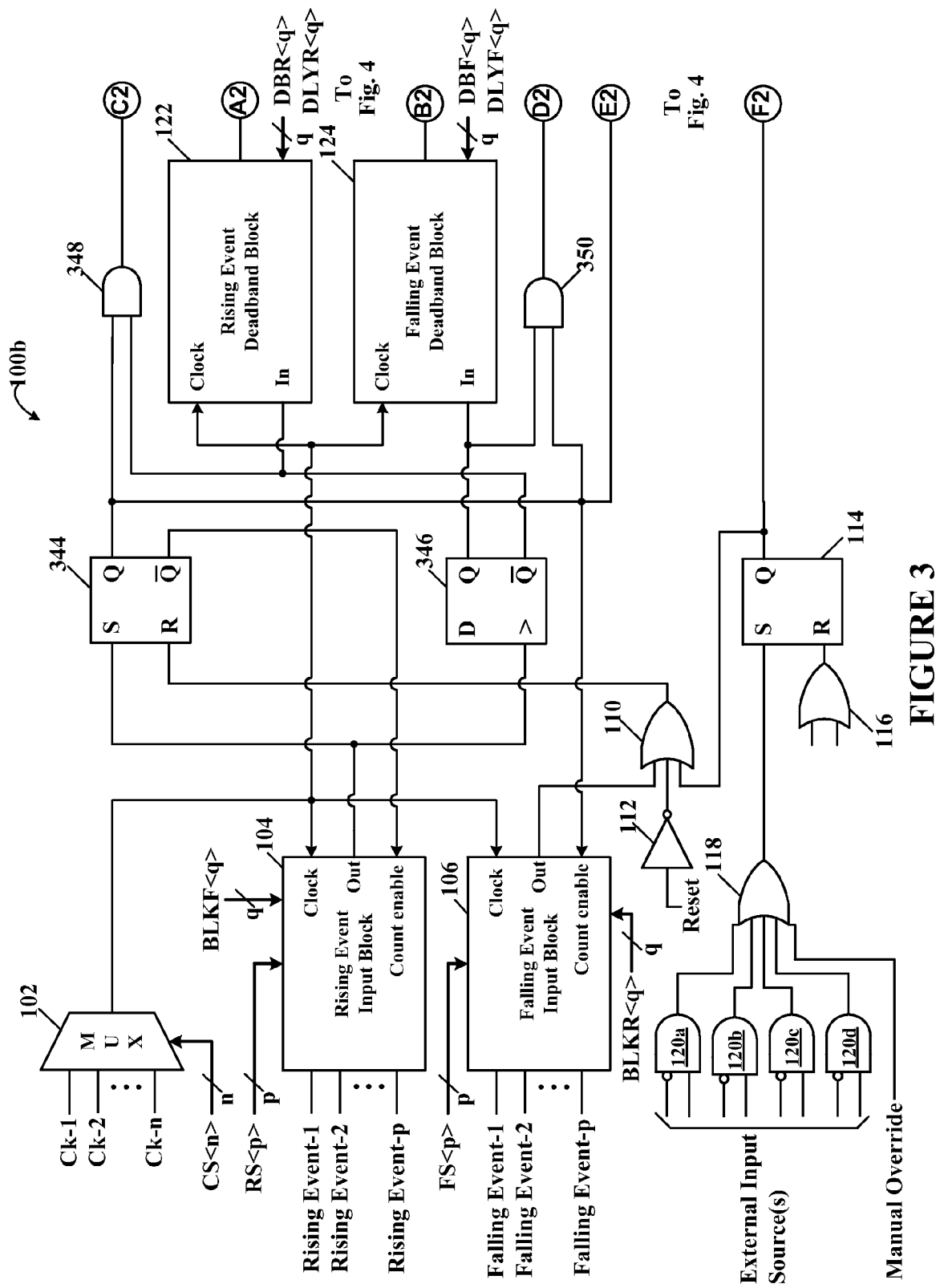
FIGS. 3 and 4 illustrate a schematic block diagram of a software configurable complementary output generator module, according to another specific example embodiment of this disclosure.
Figure 4:
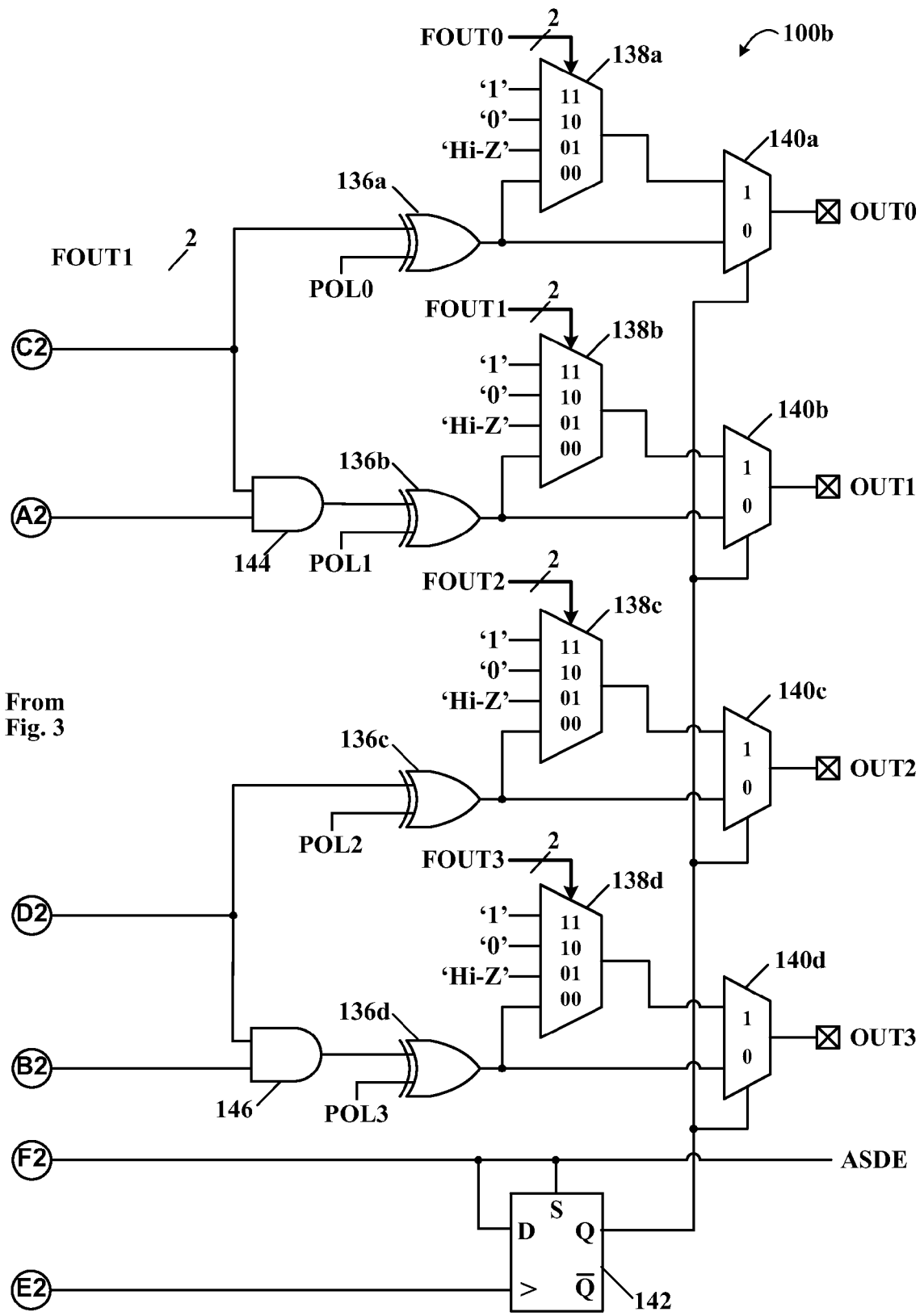
Figure 5:
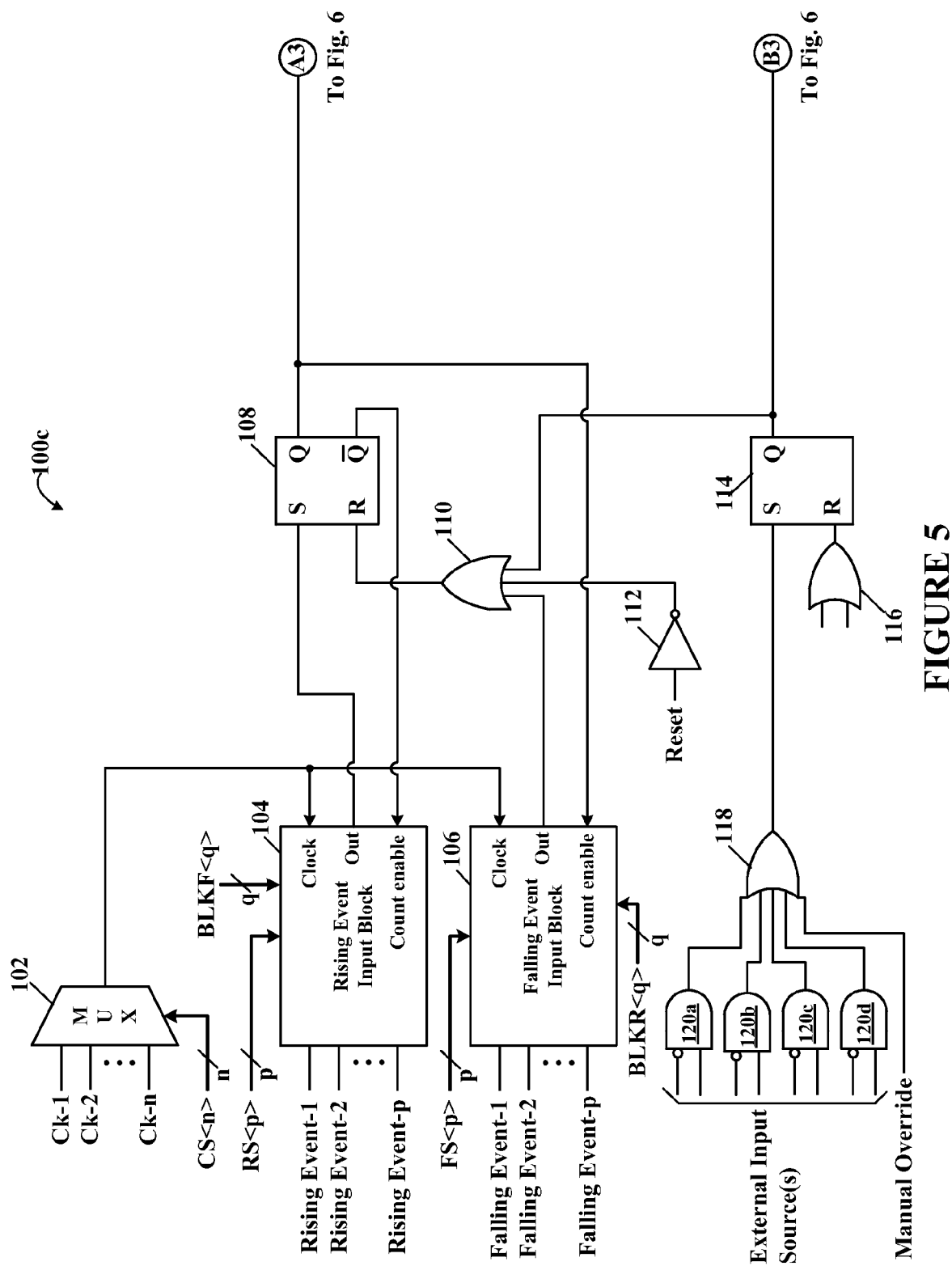
FIGS. 5 and 6 illustrate a schematic block diagram of a software configurable complementary output generator module, according to yet another specific example embodiment of this disclosure.
Figure 6:
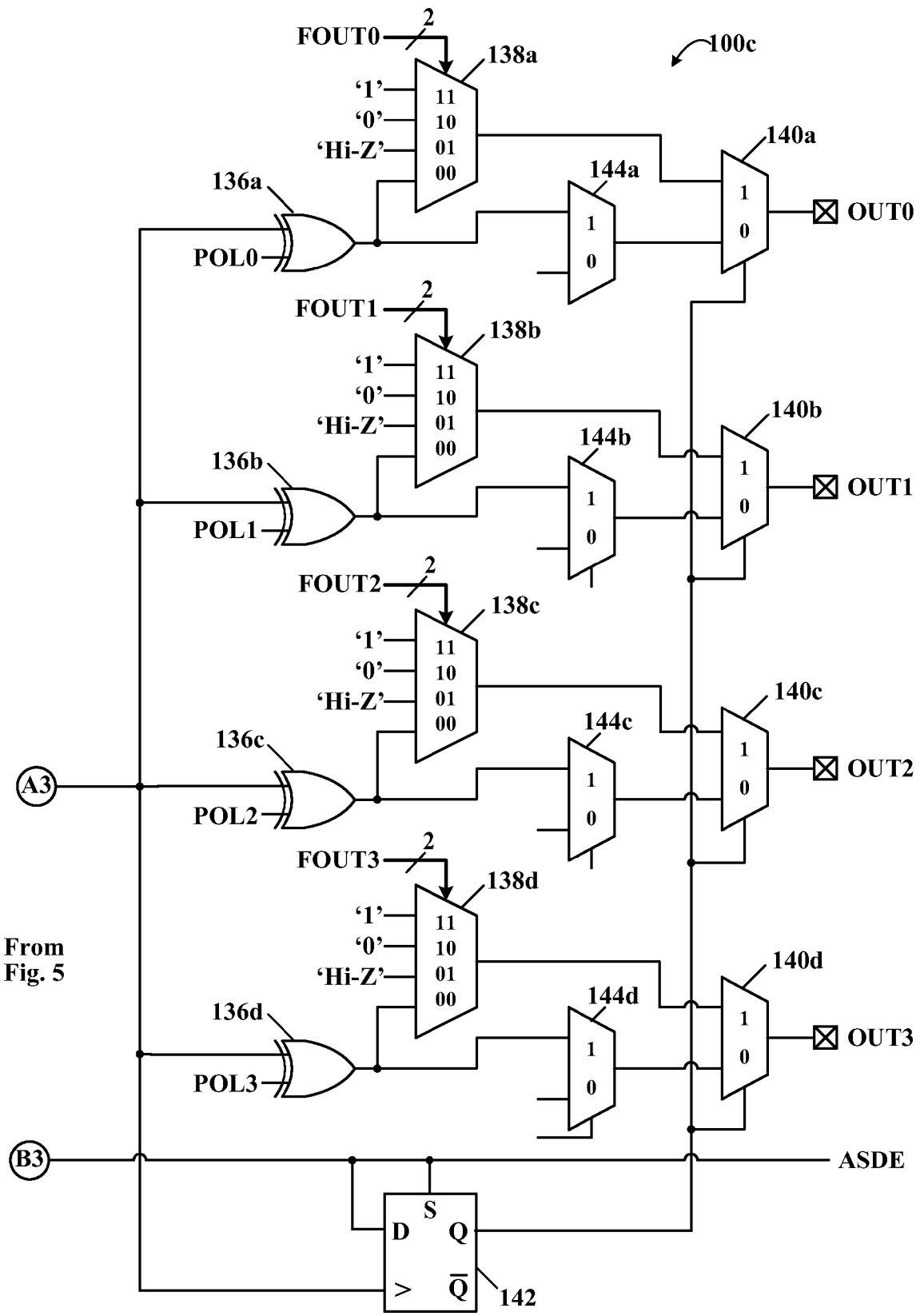

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

A complementary output generator (COG) module generates at least two complementary signals determined by rising and falling event sources, according to the teachings of this disclosure. In a simple configuration of the COG module, the rising and falling event sources are the same signal that may be, for example but is not limited to, a PWM signal having a desired period and duty cycle. The COG module may convert this single input signal into at least two complementary output signals. The frequency and duty cycle of the at least two output signals substantially match those of the single input signal. Other and further configurations will be readily apparent to one having ordinary skill in the art of digital design and having the benefit of this disclosure. A complementary output generator is disclosed in commonly owned U.S. Pat. No. 8,487,685 B2; entitled "Enhanced Complementary Waveform Generator" by Steedman, et al.; issued Jul. 16, 2013; and is hereby incorporated by reference herein for all purposes. According to various embodiments of this disclosure, a complementary output generator (COG) module may be enhanced in its functionality. For example but not limited to, at least one of the following additional new, novel and non-obvious features may be implemented in a COG module, according to specific example embodiments of this disclosure.

The COG module provides for half-bridge, full-bridge and steering of output waveforms. The COG module may provide at least six operating modes:
(1) Half-Bridge mode
(2) Push-Pull mode
(3) Forward Full-Bridge mode
(4) Reverse Full-Bridge mode
(5) Steering mode
(6) Synchronous Steering mode Half-Bridge Mode In Half-Bridge mode, a non-overlap (deadband) time is inserted between two COG module outputs to prevent power transistor shoot through current in various power supply applications.

Push-Pull Mode

In Push-Pull mode, the waveform generation of the COG module outputs alternates between the two used outputs. This alternation creates a push-pull effect required for driving some transformer based power supply designs. Deadband between outputs is generally not required when driving a transformer load.

Full-Bridge Modes

In forward and reverse full-bridge drive modes the outputs of the COG module comply with an Enhanced Capture, Compare and PWM (ECCP) style full-bridge drive. One output is modulated and the other three outputs may be held at a static value(s). ECCP applications are more fully described in Microchip Application Notes AN906, AN1178, AN1138, AN1305, AN893, AN1244, etc., available at www.microchip.com, wherein all of these application notes are incorporated by reference herein for all purposes.

Steering Modes

In steering modes, multiple signals may be steered to any of the four COG module outputs. In synchronous steering mode, changes to steering configurations only occur on the next rising event input. In non-synchronous mode, steering takes effect on the next instruction cycle.

The COG module may further provide the following features:
Selectable clock control
Selectable rising and falling event trigger sources with parallel enables
Output polarity control
Output steering
Synchronized to rising event or
Immediate effect
Deadband control with:
Analog or clocked deadband
Independent rising and falling event deadband enables
Independent rising and falling event deadband counters
Blanking control with:
Independent rising and falling event enables
Independent rising and falling event blanking counters
Phase control with:
Independent rising and falling event enable delays
Independent rising and falling event phase counters
Auto-shutdown control with:
Selectable shutdown sources with parallel enables
Auto-restart enable
Auto-shutdown over-ride control Referring now to the drawings, the details of specific example embodiments are schematically illustrated. Like elements in the drawings will be represented by like numbers, and similar elements will be represented by like numbers with a different lower case letter suffix.

Referring to FIGS. 1 through 6, depicted are schematic block diagrams of software configurable complementary output generator (COG) modules, according to specific example embodiments of this disclosure. Other and further COG modules may be software configured within the scope of this disclosure and are contemplated herein. The COG modules are generally represented by the numeral 100 (FIGS. 1 and 2—100a, FIGS. 3 and 4—100b, and FIGS. 5 and 6—100c).

Selectable Clock Source

A clock source, Ck, may be selected with a multiplexer 102. The multiplexer 102 may be controlled from a clock source register (not shown) having an output CS<n>, where n may be a binary value. The selected clock source, Ck, may be used throughout the COG module 100, as more fully described hereinafter.

Figure 7:
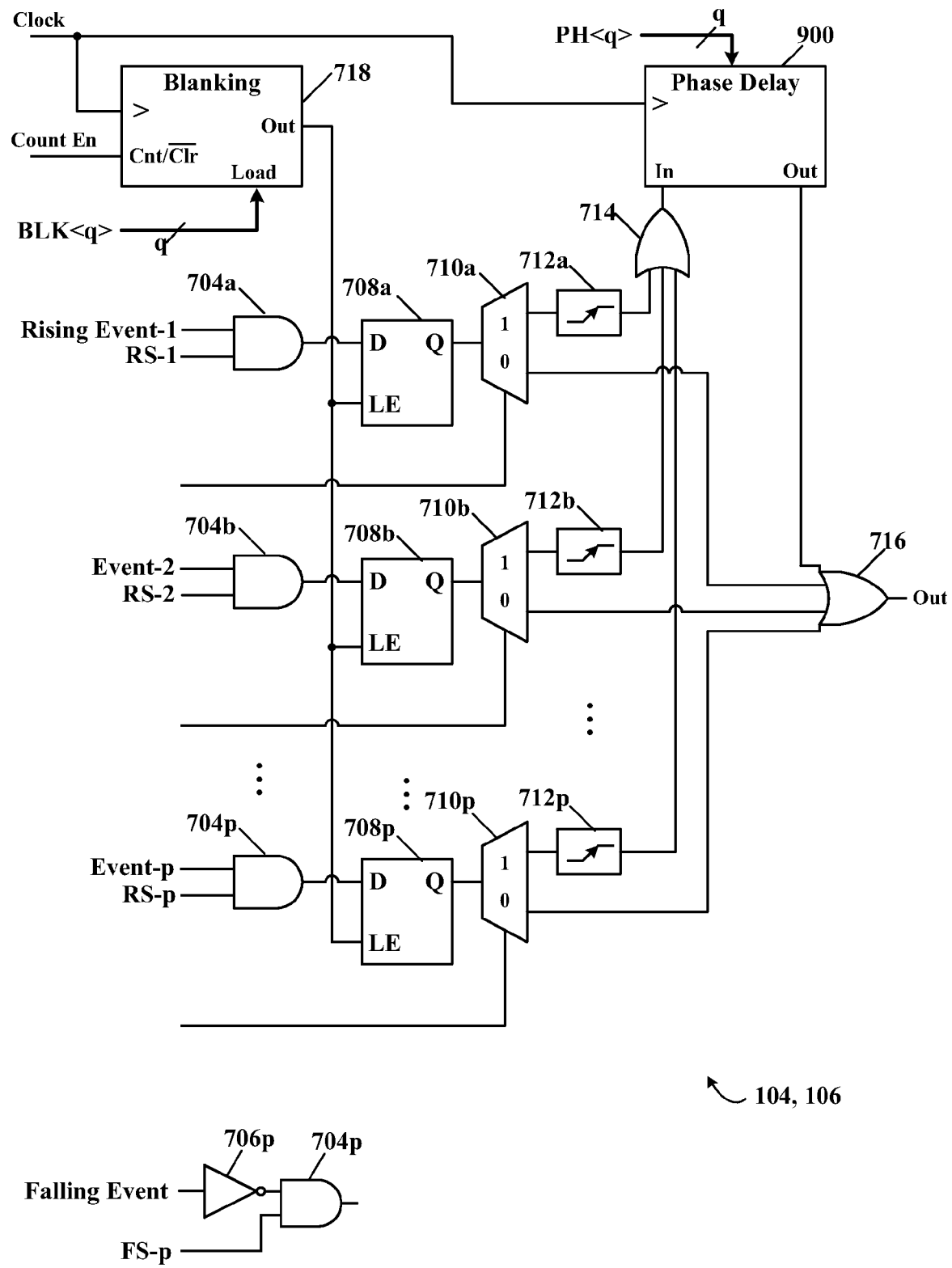
FIG. 7 illustrates a schematic block diagram of a circuit for rising and falling events input blocks, blanking and phase delay as shown in FIGS. 1-6, according to specific example embodiments of this disclosure.

Referring also to FIG. 7, depicted is a schematic block diagram of a circuit for rising and falling event input blocks, and blanking and phase delays as shown in FIGS. 1-6, according to specific example embodiments of this disclosure.

Selectable Rising and Falling Event Trigger Sources

Parallel enables for all rising and falling event trigger source inputs provide for more operational flexibility. At least one rising event source may be selected with the rising event input block 104. Control of the rising event input block 104 may be with a rising event source register (not shown) having an output RS<p>. The rising event source register may store a p-bit pattern corresponding to the at least one rising event source(s) desired. At least one falling event source may be selected with a falling event input block 106. Control of the falling event input block 106 may be with a falling event source register (not shown) having an output FS<p>, where the falling event source register may store a p-bit pattern corresponding to the at least one falling event source(s) desired. The rising and falling events may be from the same source, e.g., a single output from a signal source. This signal source(s) may be synchronous or asynchronous with the selected clock source, Ck. The rate at which the rising event occurs may determine the signal frequency. The time from the rising event input to the falling event input may determine the signal duty cycle.

Independent Rising and Falling Event Enable Delays

Separate and independent rising and falling event enable delays, e.g., blanking delays, provide for more operational flexibility. A rising event source may be selected when AND gate 704p has a logic high on the RS-p input thereto. A falling event source may be inverted to become a rising signal with an inverter 706p and selected when AND gate 704p has a logic high on the FS-p input thereto. Each AND gate 704 output is coupled to a D-input of a respective latch 708 acting as both a gate and storage register of the event logic level. When the latch enables (LE) of the latches 708 are at a logic low ("0") the logic levels at the D-inputs thereof will not pass to the Q-outputs and the Q-outputs will maintain the logic levels of the D-inputs from the last time that the latch enables (LE) were at a logic high. When the latch enables (LE) are at a logic high the Q-outputs will follow the D-inputs of the latches 708.

The latch enables (LE) of the latches 708 may be coupled to a blanking counter 718 associated with falling events, and the latch enables (LE) of the latches 708 used for storing the falling events may be coupled to a blanking counter 718 associated with rising events. An amount of blanking delay, if any, is determined by the blanking counter 718 whose blanking time is loaded from a blanking register (not shown) having an output BLK <q>. One blanking counter 718 associated with the rising events has its output, BLKR<q>, coupled to the LE inputs of the latches 708 used for falling events, and a second blanking counter 718 associated with the falling events has its output, BLKF<q>, coupled to the LE inputs of the latches 708 used for the rising events. Thus the respective rising and falling blanking counters 718 may "inhibit or lockout" other rising or falling event signals from being recognized before a required blanking time has expired after the end of the preceding rising or falling event. For a zero value, e.g., BLK<000>, there is no blanking time introduced.

Edge and Level Sensing of Event Sources

Figure 8:
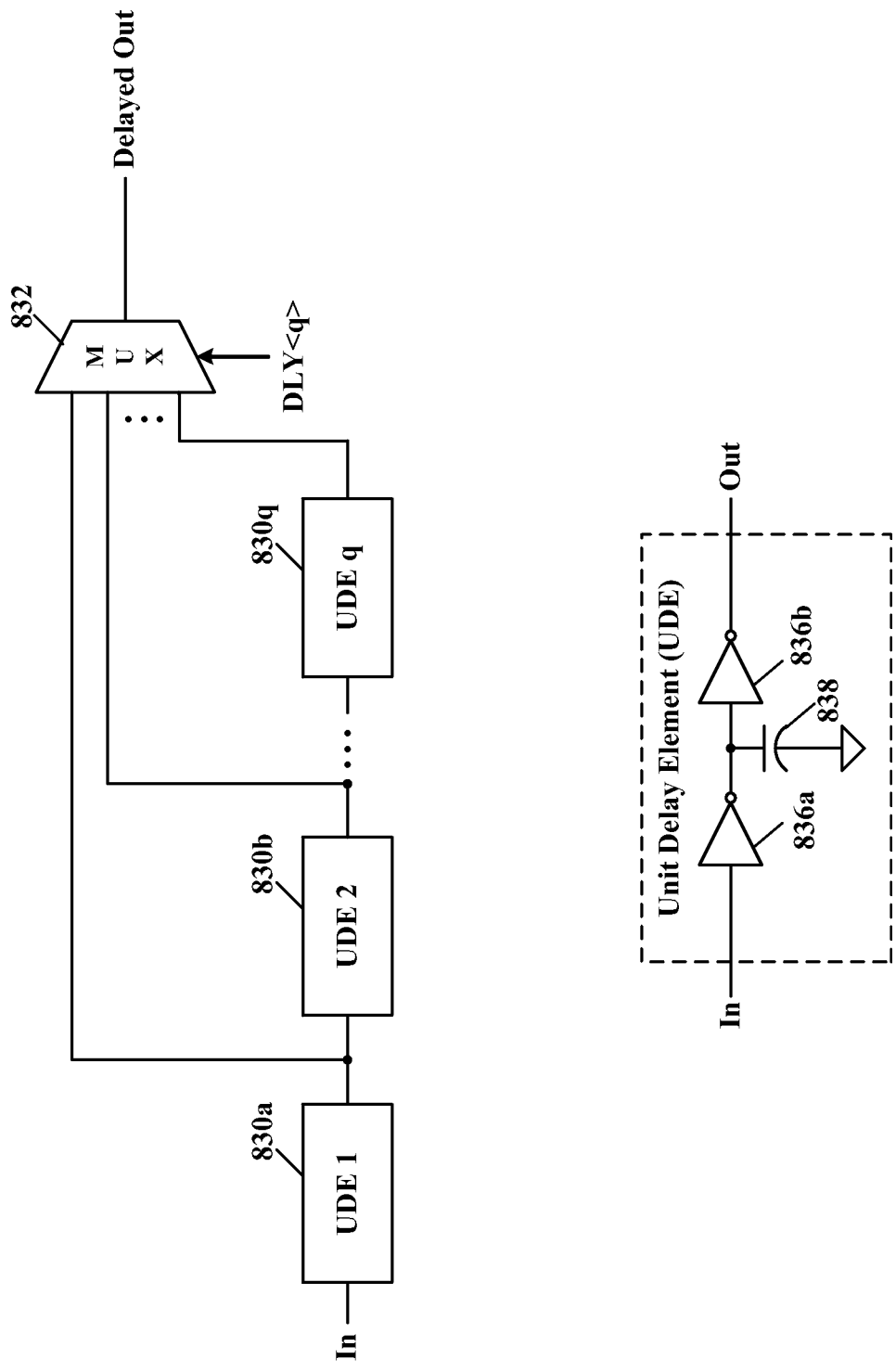
FIG. 8 illustrates a schematic block diagram of a more detailed schematic block diagram of an analog time delay circuit, according to the teachings of this disclosure.
Figure 9:
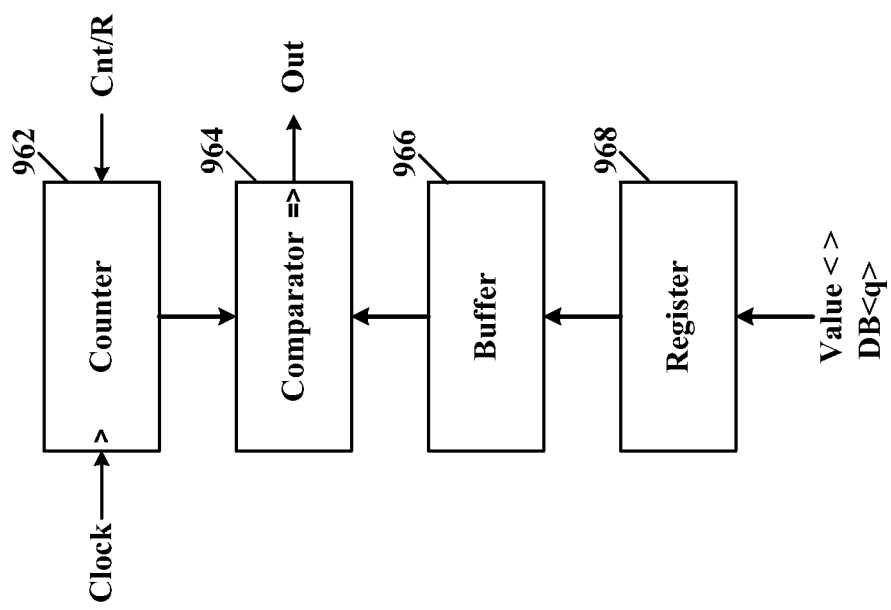
FIG. 9 illustrates a more detailed schematic block diagram of a digital time delay circuit, according to the teachings of this disclosure.

The rising and/or the falling event sources may be selected as level or edge detection sensitive. Each Q-output of the latches 708 may be coupled through a switch (demultiplexer) 710 to either a level detector 712 or directly to an input of an OR gate 716. When the switch 710 couples the Q-output of the latch 708 directly to the input of the OR gate 716, a logic high of the event will cause the output of the OR gate 716 to go to a logic high. When the Q-output of the latch 708 is coupled to the level detector 712 then a signal level "rising edge" to a logic high will cause the output of the OR gate 714 to go to a logic high. The output of the OR gate 714 may be coupled to an input of a phase delay block 900 and an output thereof may be coupled to an input of the OR gate 716. The phase delay block 900 may be used to introduce a delay (phase) to the selected rising and/or falling event(s) according to a value from a phase delay register (not shown) having an output PH<q>, where q is a binary value. When q is zero (0) there is no phase delay applied to the selected rising and/or falling event. This phase delay may be digitally derived as shown in FIG. 9, or derived by analog means as shown in FIG. 8.

Referring back to FIGS. 1-6, the output from the rising event input block 104 is coupled to a set (S) input of the RS latch 108, and when the rising event input block 104 output goes to a logic high the RS latch 108 will be set and the Q-output thereof will go to a logic high. However if a logic high from the OR gate 110 is coupled to the reset (R) input of the RS latch 108 then the Q-output thereof will go back to a logic low. The RS latch 108 will reset and its Q-output will go to a logic low when the falling event input block 106 output asserts a logic high, e.g., a falling event has been detected, the input of the inverter 112 is pulled to a logic low, or the Q-output of RS latch 108 goes to a logic high. The RS latch 108 is reset dominant, and therefore any falling event from the OR gate 110, e.g., falling event signal from the falling event input block 106, forced reset from the inverter 112, and/or the RS latch 114.

Edge Versus Level Sensing

In general, events that are driven from a periodic source should be edge detected and events that are derived from voltage thresholds at a target circuit, e.g., switched-mode power supply (SMPS), should be level sensitive. Consider the following two examples: The first example is an application in which the period is determined by a 50% duty cycle clock and the COG module output duty cycle is determined by a voltage level fed back through a comparator. If the clock input is level sensitive then duty cycles less than 50% may exhibit erratic operation. The second example is similar to the first except that the duty cycle is close to 100%. The feedback comparator (e.g., of the SMPS) high-to-low transition trips the COG module drive off but almost immediately the period source turns the drive back on. If the off cycle is short enough then the comparator input may not reach the low side of the hysteresis band, precluding an output change. The comparator output stays low and without a high-to-low transition to trigger the edge sense then the drive of the COG module output will be stuck in a constant drive-on condition.

Rising Event

The rising event may start the output signal active duty cycle period. The rising event is the low-to-high transition of a selected rising event source(s). When the rising phase delay is zero, the output may start immediately. In some modes rising dead-band time may be applied after an optional phase delay. The rising event source may cause any or all the following actions:

Start rising event phase delay counter (if enabled)
Start falling event input blanking (if enabled)
In half-bridge mode; after phase delay, start rising deadband delay (if enabled)
In half-bridge mode, set OUT0 output after rising deadband delay
In half-bridge mode, clear OUT1 output after rising phase delay
In steering modes, set OUT0 output after synchronization (if enabled)
In push-pull modes, set OUT0 after OUT1 was cleared or set OUT1 after OUT0 was cleared
In full-bridge modes, set OUT3 in forward or set OUT1 in reverse Falling Event The falling event terminates the output signal active duty cycle period. The falling event is the low-to-high transition of the selected falling event source(s). When the falling phase delay is zero, the output may end immediately. In some modes falling dead-band time may be applied after the optional phase delay. The falling event source may cause any or all the following actions:

Start falling event phase delay counter (if enabled)
Start rising event input blanking (if enabled)
In half-bridge mode; after phase delay, start falling deadband delay (if enabled)
In half-bridge mode, set OUT1 output after falling deadband delay
In half-bridge mode, clear OUT0 output after falling phase delay
In steering modes, clear OUT0 output. (No synchronization for falling)
In push-pull modes, clear OUT0 if OUT0 is set or clear OUT1 if OUT1 is cleared
In full-bridge modes, clear OUT3 in forward or clear OUT1 in reverse Preferably, all modes are falling dominant. The rising source(s) feeds the set input and the falling source(s) feeds the reset of the SR Latch 108. The SR Latch 108 is reset dominant, and the falling source will always "win", thereby clearing the output of the SR latch 108.

Blanking Control

Input blanking is a function where the event inputs of any selected analog input, e.g., rising and/or falling event, may be ignored, e.g., masked or blanked, for a short period of time. This is to prevent electrical transients (noise) caused by the turn-on/off of power components from generating a false event. The COG module may contain a rising event blanking timer (counter) and a falling event blanking timer (counter). The rising and falling event blanking timers (counters) may be cross coupled with the falling and rising evens that they may be blanking. For example, the falling event blanking event blanking timer (counter) may be used to blank rising input events and the rising event blanking event blanking timer (counter) may be used to blank falling input events. Once started, blanking may extend for the time specified by the corresponding blanking registers (not shown) outputs BLKF<q> and BLKR<q>. Blanking is timed by counting clock periods from zero up to the value in the respective blanking register (FIG. 9), or by analog time delays selected by a multiplexer (FIG. 8).

The following features may be available for blanking:

Independent rising event and falling event blanking mode selection

Independent rising event and falling event blanking counters

The following blanking modes may be available:

Blanking disabled

Immediate blanking

Blanking Disabled

When the blanking function 718 is disabled the rising event and/or falling event inputs may pass immediately through latches 708 and demultiplexer 710 without any blanking intervention (see FIG. 7).

Immediate Blanking

With immediate blanking, a rising event may immediately start the rising event blanking counter that may blank falling event inputs. A falling event may immediately start the falling event blanking counter that may blank rising event inputs. Immediate blanking may be enabled by writing a non-zero value, BLK<q>, to the appropriate blanking counter. The blanking counters may be incremented on the rising edge of a clock pulse. As the rising event and falling events may be from analog signals and therefore unsynchronized, there may be some jitter in the actual blanking implemented each cycle. The maximum jitter may be equal to one clock period.

Blanking Event Overlap

If there is any overlap between blanking events, the following sequence of events may occur, where BKx is the active blanking case (rising or falling event) and BKy is the opposite case (falling or rising event):

BKx is counting up, not yet complete

BKy counting is initiated

Blanking controls now switch to BKy enables from BKx enables

BKx resets to zero

BKy continues counting until its count is complete

BKy resets to zero (normal operation)

Phase Delay

A phase delay counter 900 may be used to delay assertion of a rising event. The phase delay time is set by the value contained in the rising phase delay register (not shown) outputs PH<q>, where q is a binary number. The delay from the input rising event signal switching to the actual assertion of the events may be implemented the same as the dead-band and blanking delays. When the PH<q> value is zero, rising event phase delay is disabled, thereby allowing the rising event signal to pass straight through to the OR gate 716. Independent rising and falling phase enables and blanking timers (counters) may be provided as shown in FIGS. 8 and 9.

Dead-Band Control

Figure 10:
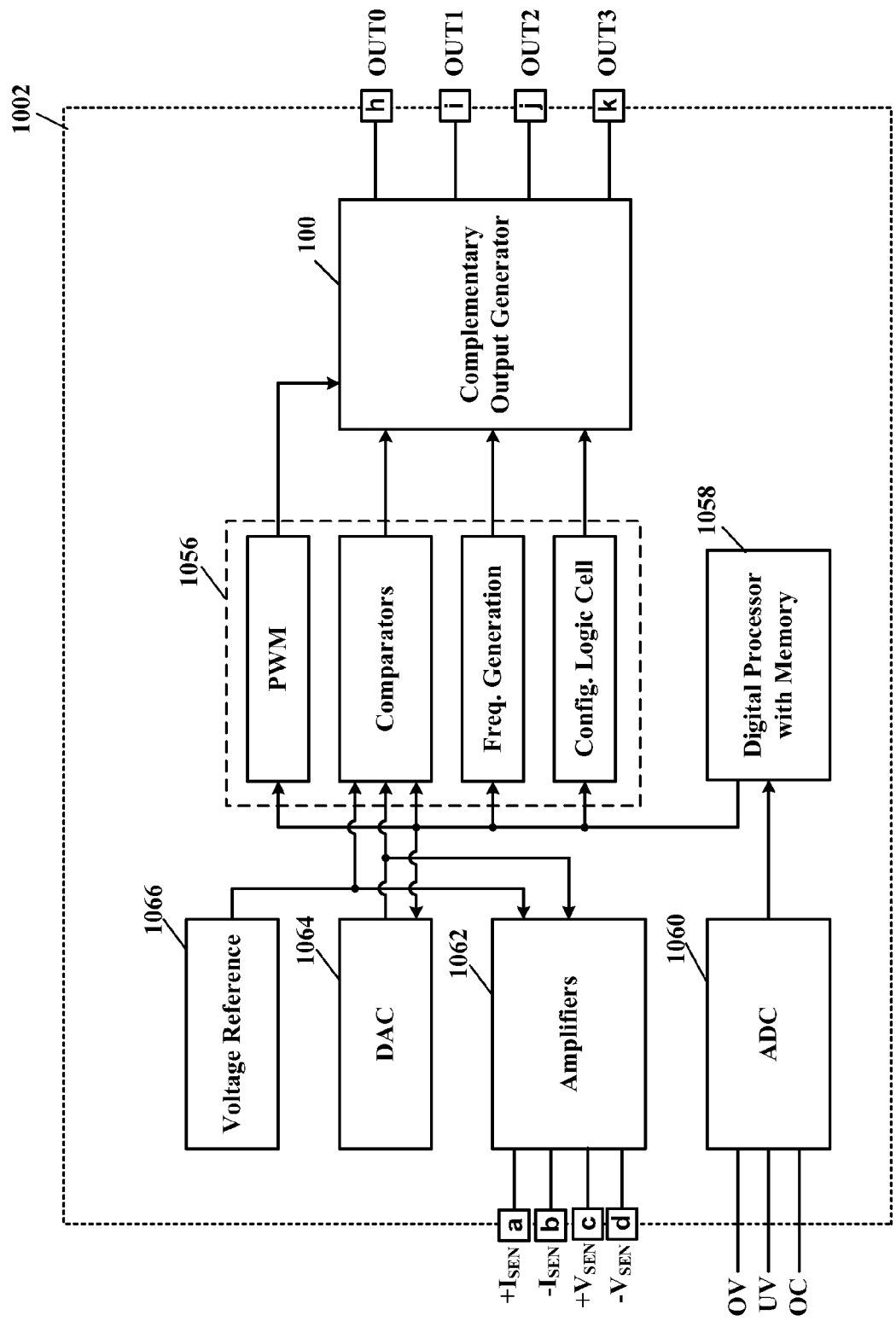
FIG. 10 illustrates a schematic block diagram of a mixed signal integrated circuit device having a complementary output generator, according to the teachings of this disclosure.

Dead-band control may provide for non-overlapping output signals to prevent shoot-through current in, for example but not limited to, half-bridge mode external power switches (FIG. 11) controlled by a signal generator 1056 (FIG. 10). The rising event deadband block 122 and the falling event deadband block 124 may each comprise a digital deadband delay timer comprised of a clocked counter 962 and comparator 964 (FIG. 9), and/or an analog deadband delay block comprised of a plurality of unit delay elements 830 and a programmably selectable multiplexer 832 (FIG. 8). Rising and falling deadband times may be individually programmed for each of these deadband blocks 122, 124 based upon values from their respective dead-band count or time delay registers (not shown) having outputs DBR<q> or DLYR<q>, and DBF<q> or DLYF<q>, respectively.

Rising Event Dead-Band

Rising event deadband control may be used to delay the turn-on of a primary power device after the turn-off of a secondary power device.

Falling Event Dead-Band

Falling event deadband control may be used to delay the turn-on of a secondary power device after the turn-off of a primary power device.

Dead-Band Overlap

There are two cases of deadband overlap, rising-event to falling-event and falling-event to rising-event, and each one is treated differently depending upon system requirements.

Rising-Event to Falling-Event Overlap

In this case, the falling event occurs while the rising event deadband counter is still counting. The following sequence of events may occur: the rising event deadband counter is counting up but as not yet completed its count, the falling event deadband counter counting is initiated (valid falling event signal), output waveform control is immediately handed to falling event signals, the rising event deadband counter resets on the next clock edge, the falling event deadband counter continues counting until its count is complete, and then the falling event deadband counter resets on the next clock edge (normal operation).

Falling-Event to Rising-Event Overlap

In this case, the rising event occurs while the falling event deadband counter is still counting. The following sequence of events may occur: the falling event deadband counter is counting up but as not yet completed its count, the rising event deadband counter counting is initiated (valid rising event signal), output waveform control is immediately handed to rising event signals, the falling event deadband counter resets on the next clock edge, the rising event deadband counter continues counting until its count is complete, and then the rising event deadband counter resets on the next clock edge (normal operation).

For example, a falling event dead-band delays the turn-on of output, OUT1, from when the output, OUT0, is turned off. The falling event dead-band time starts when the falling event output goes to a logic high. The falling event output goes high coincident with the unblanked falling input event. The falling event dead-band time is set by the value of the output DBF<q>, where q is a binary number, contained in a falling event dead-band time register (not shown). When the value of DBF<q> is zero, falling event dead-band time delay may be disabled.

Clocked Dead-Band Time Delay

Clocked dead-band time delay allows for dead-band times that may be equal to or a multiple of the clock frequency. Independent rising and falling event enables and/or independent rising and falling event dead-band counters may be provided. The clocked dead-band time delay(s) may be programmed. Referring to FIG. 9, depicted is a more detailed schematic block diagram of a digital time delay circuit that may be used according to the teachings of this disclosure. This time delay circuit may comprise a counter 962 that counts each clock pulse and outputs its count value to a comparator 964. The comparator 964 compares the count value to a time value, e.g., blanking, phase delay and/or dead-band times that may be stored in a respective blanking, phase delay and/or dead-band time register 966. When the count value is equal to or greater than the time value, an output, Out, from the comparator goes to a logic high. Respective register(s) 968 may be used to asynchronously store the time values for blanking, phase delay and/or dead-band times for subsequent synchronous transfer to the respective buffer(s) 966.

Analog Dead-Band Time Delay

Analog dead-band time delay allows for small dead-band times (higher granularity time selection) that may be independent of the clock source of the COG module. For example, selectable 5 nanosecond time delay steps may be implemented independent of clock times by utilizing selection of the appropriate number of series connected UDEs 830. Independent rising and falling analog dead-band time delays may be provided and may be programmably selected. This provides better and more flexible control for applications in high frequency and high efficiency power conversion devices, e.g., SMPS.

Referring to FIG. 8 illustrates a more detailed schematic block diagram of an analog time delay circuit, according to the teachings of this disclosure. This time delay circuit may comprise a plurality of unit delay elements (UDEs) 830 and a multiplexer 832. A specific time delay may be obtained by selection of the appropriate number of series coupled UDEs 830 with the multiplexer 832 that may be controlled from an input selection address, DLY<q>, from a delay register (not shown). When the output from the multiplexer 832 goes to a logic high the appropriate output of the deadband module is asserted.

Output Steering

The COG module may allow any combination of outputs, e.g., OUT0, OUT1, OUT2 and/or OUT3, to be a modulated signal, e.g., PWM signal. Additionally, the same signal may be simultaneously available on any one or more of the other outputs. The COG module auto-shutdown operation may also apply to the output steering and may only affect those outputs that may be enabled (see FIGS. 5 and 6).

When the output steering event will happen may be programmable wherein an immediate output steering event may happen at the end of the instruction cycle requesting the output steering event, or the effective steering event update may happen at the beginning of the next rising event. The immediate output steering event may cause an incomplete waveform, but is useful when a user's firmware needs to immediately remove a signal from the output. When the output steering event occurs substantially simultaneously with the next rising event, a complete waveform will always be produced.

Output Polarity Control

The polarity of each output, OUTx, may be selected independently with exclusive OR gates 136. When POLx is at a logic low there is no output inversion of the input logic level to the exclusive OR gate 136 (outputs, OUT, are at an "active high"). When POLx is at a logic high there is output inversion of the input logic level to the exclusive OR gate 136 (outputs, OUT, are at an "active low"). However, polarity does not affect the override values. Output polarity may be selected with the POL0-POL3 bits from a polarity control register (not shown).

Auto-Shutdown Control

Auto-shutdown may be used to immediately override the current output values with specific overrides 138 that allow for safe shutdown of the power circuit. A restart function may also be used under certain conditions. Selectable shutdown sources 120, auto-restart enable, and auto-shutdown override control may be implemented with, for example but not limited to, RS latch 114, OR gate 118, AND gates 120, D-latch 142, and/or multiplexers 138 and 140.

Shutdown

There are two ways to generate a shutdown event: manual override at an input to OR gate 118 or an external input source through one or more of the AND gates 120.

Manual Override

The auto-shutdown registers may be used to manually override the operational functions if required. By setting an ASDE bit, a shut-down event may be generated. The ASDE bit may be settable even if the module is disabled. This will allow the ASD override states selected with the multiplexers 138 and coupled to the outputs, OUTx, through the multiplexers 140 even if the COG module is disabled. Multiplexers 138 and 140 are shown to perform this function, but one having ordinary skill in digital circuit design and the benefit of this disclosure could design other equally effective circuits, and those circuits are contemplated herein. If auto-restart is disabled, this override may persist as long as the control bit is set in the auto-shutdown control register (not shown). If auto-restart is enabled, the bit will automatically self-clear and resume operation on the next rising edge event.

External Input Source

Any of the given sources that are available for event generation are available for system shut-down. This is so that external circuitry can monitor and force a shutdown without any software overhead. Note: an important consideration for the auto-shutdown (ASD) sources are that they are level sensitive, not edge sensitive, and as long as the ASD level persists, the ASD event is in progress. The specific ASD sources may be the AND gates 120.

Restart

After an auto-shutdown event has occurred, there are two ways to have the COG module resume operation:

Manual Restart

Restart on the next rising edge event once the auto-shutdown source has gone inactive and then after the ASDE bit from S-R Latch 114 has been cleared, for example, in software via the OR gate 116.

Auto-Restart

Automatically restart on the next rising edge event once the auto-shutdown event signal has been cleared. Note: the ASDE bit cannot be cleared in software if the auto-shutdown condition is still present on at least one of the inputs to OR gate 118.

Output Drive

The multiplexers 140 may maintain overrides from the multiplexers 138 until there is a valid rising event to indicate that normal operation should resume, thereby clearing the D flip-flop 142. The rising event may have edge or level dependencies depending on how it may be configured. The outputs from the multiplexers 138 may be selected by a forced output control, FOUT. These forced outputs may be, for example but are not limited to, logic high, logic low, high impedance (Hi-Z), or the normal event driven logic levels.

Buffer Updates

The buffers for deadband, phase and blanking may be loaded with the corresponding register value at different times during the COG module operation. These times may be when the COG module is disabled or enabled.

COG Module Disabled

When the COG module is disabled, a write to the deadband, phase and blanking registers may also directly load the respective buffers as well.

COG Module Enabled

When the COG module is enabled, it is necessary to ensure that when values are changed, that all buffers update at substantially the same time. An example is when a device is running at a low clock speed (e.g., 1 MHz) with a fast period coming into the COG module (e.g., 500 kHz). Under this circumstance, it would require several clock periods to update the deadband, phase delay and blanking values with new values. This updating across multiple periods is not desired and so a way to synchronize the buffer update should be used. The steps for loading the buffers may be as follows:
1. Update all register values
2. Set a load bit
3. On next rising edge of the falling event signal, latch the falling event signal:
   a) close latch for the falling event signal
   b) load the rising event dead band buffer
   c) load the falling event blanking buffer
   d) load the phase delay buffer
   e) open the latch for the falling event signal
4. On next rising edge of the rising event, load:
   a) close latch for the falling event signal (the falling event signal generates the rising event signal, so latching falling event will prevent changes in the rising event)
   b) load the dead band falling event register
   c) load the dead band rising event register
   d) Clear the load bit to indicate load complete.
   e) Open the falling event latch.

The load bit can not be cleared in software, it is only settable in software and cleared in hardware. This is to prevent unintended operation during the loading procedure.

COG Module Reset

The COG module may be reset whenever a reset signal is asserted at the input to inverter 112. If an active low reset is applied to inverter 112, then the SR Latch 108 is held in its reset state. The output of the inverter 112 is also what would reset all of the registers, counters, etc., coupled thereto. When the reset is asserted the following actions may occur: Registers are reset to their default values, blanking counters are reset, deadband counters are reset, and flip-flops and latches in any machines or state generation circuits are reset to their default values.

Referring to FIG. 10, depicted is a schematic block diagram of a mixed signal integrated circuit device having a complementary output generator, according to the teachings of this disclosure. The mixed signal integrated circuit device 1002 that may be used for controlling a switched-mode power supply (SMPS) (see FIG. 11) or a half or full bridge power device (see FIG. 12), e.g., a motor, etc. The mixed signal integrated circuit device 1002 may comprise one or more of the following: a COG module 100, a signal generation module 1056, a digital processor with memory 1058 (e.g., microcontroller), an analog-to-digital converter (ADC) 1060, a plurality of amplifiers 1062, a digital-to-analog converter (DAC) 1064 and a voltage reference 1066. The ADC 1060 may and input coupled to an analog multiplexer (not shown) and the plurality of amplifiers 1062 may be a plurality of differential input amplifiers, e.g., operational amplifiers. The signal generation module 1056 may comprise a pulse width modulation (PWM) module, comparators, a frequency generation module, and/or configurable logic cells. The outputs from the signal generation module 1056 may be selectable by the COG module 100.

Figure 11:
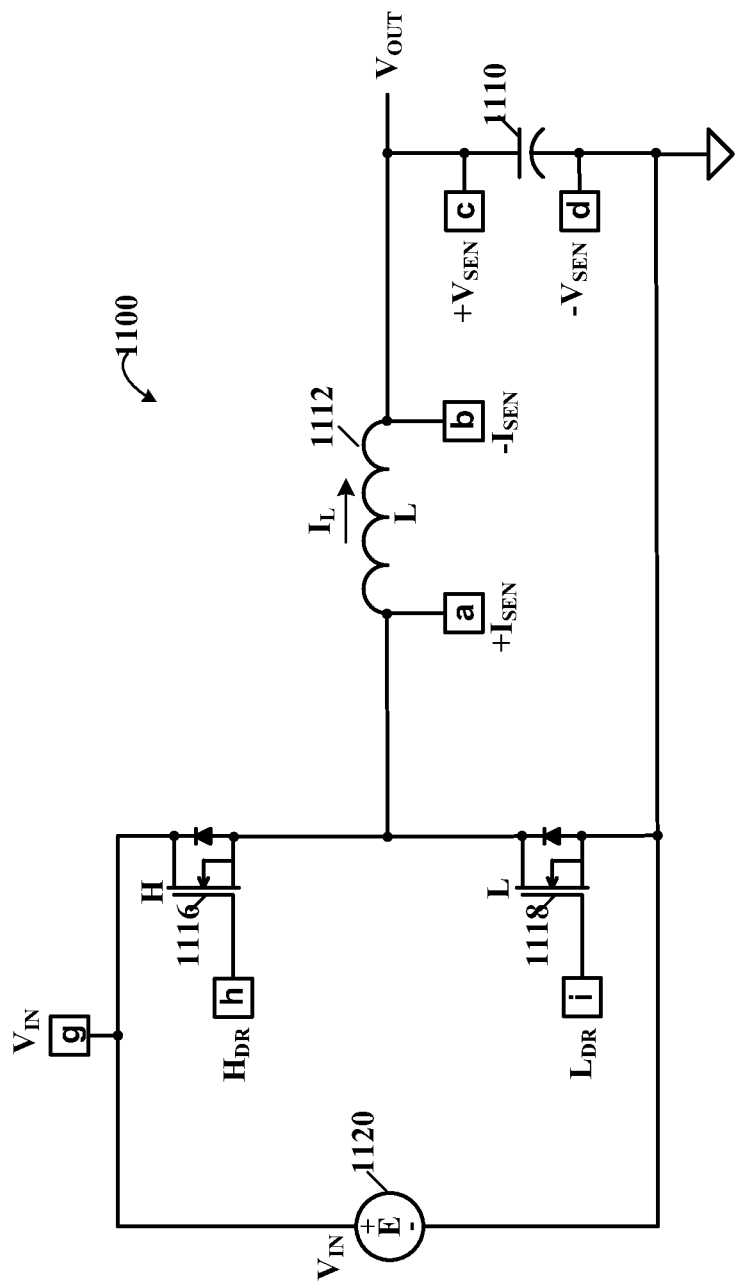
FIG. 11 illustrates a schematic diagram of power components used in a typical switched-mode power supply (SMPS) application.

Referring to FIG. 11, depicted is a schematic diagram of power components used in a typical SMPS. The power components of the SMPS 1100 are fed from a voltage source, Vin, and may comprise a high transistor 1116, a low transistor 1118, an inductor 1112, a filter capacitor 1110 all coupled to the mixed signal integrated circuit device 1002 shown in FIG. 11.

Figure 12:
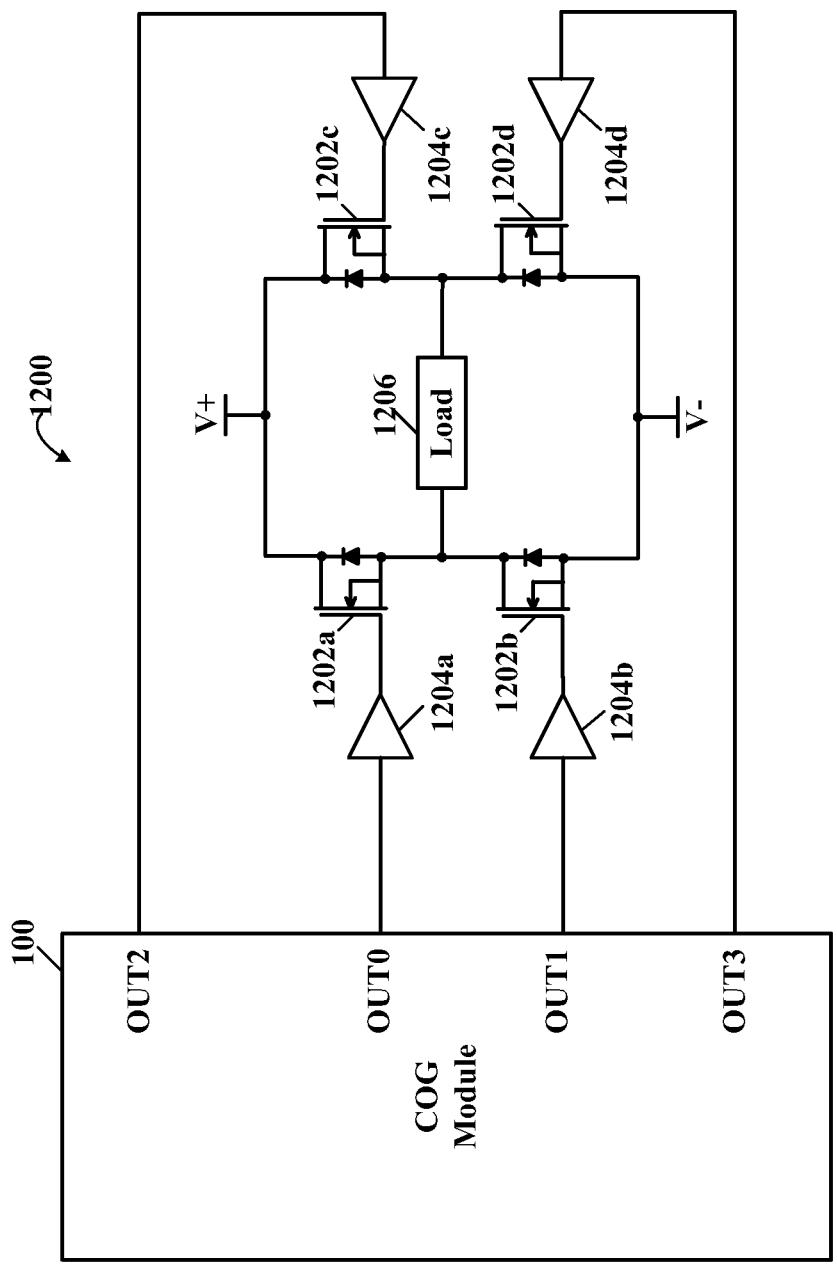
FIG. 12 illustrates a schematic diagram of power components used in a typical full-bridge application driving a load.

Referring to FIG. 12, depicted is a schematic diagram of power components used in a typical full-bridge application driving a load. The power circuit, generally represented by the numeral 1200, may comprising drivers 1204 and power transistors 1202 that may be coupled to a load in either a half-bridge or full-bridge configuration (full-bridge shown). Any one or more of the outputs OUT(0-3) may be driven from the rising and falling event inputs, e.g., from a signal source, and/or forced to a certain logic level(s) with the multiplexers 138. In Full-Bridge mode, all four outputs OUT(0-3) may be used. In the forward mode OUT0 may be driven to an active state, OUT3 may be modulated while OUT1 and OUT2 may be driven to an inactive state. In the reverse mode OUT2 may be driven to an active state, OUT1 may be modulated while OUT0 and OUT3 may be driven to an inactive state.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A complementary output generator module for a microcontroller, wherein the complimentary output generator is configurable through a processing core of the microcontroller and comprises:
   a clock input coupled to a clock source;
   a plurality of rising event inputs that are programmably selectable, wherein at least one of the selected rising event inputs initiates a rising event signal synchronous with the clock source when at least one rising event occurs at a respective selected one of the rising event inputs;
   a plurality of falling event inputs that are programmably selectable, wherein at least one of the selected falling event inputs initiates a falling event signal synchronous with the clock source when at least one falling event occurs at a respective selected one of the falling event inputs; and
   a plurality of outputs, wherein
      a first one of the plurality of outputs asserts a first output drive signal upon detection of the rising event signal until detection of the falling event signal, and
      a second one of the plurality of outputs asserts a second output drive signal upon detection of the falling event signal until detection of a next rising event signal.

2. The complementary output generator module according to claim 1, further comprising a clock multiplexer coupled between the clock input and a plurality of clock sources, wherein the clock multiplexer is adapted to select a one of the plurality of clock sources.

3. The complementary output generator module according to claim 1, further comprising a rising event blanking time circuit for inhibiting the rising event from generating the rising event signal until after the rising event blanking time circuit has timed out.

4. The complementary output generator module according to claim 3, wherein the rising event blanking time circuit comprises:
   a counter coupled to the clock source;
   a comparator coupled to the counter; and
   a blanking time register coupled to the comparator.

5. The complementary output generator module according to claim 3, wherein the rising event blanking time circuit comprises:

a plurality of series connected unit delay elements; and
a multiplexer having inputs coupled to respective ones of the plurality of series connected unit delay elements.

6. The complementary output generator module according to claim 1, further comprising a falling event blanking time circuit for inhibiting the falling event from generating the falling event signal until after the falling event blanking time circuit has timed out.

7. The complementary output generator module according to claim 6, wherein the falling event blanking time circuit comprises:
a counter coupled to the clock source;
a comparator coupled to the counter; and
a blanking time register coupled to the comparator.

8. The complementary output generator module according to claim 6, wherein the falling event blanking time circuit comprises:
a plurality of series connected unit delay elements; and
a multiplexer having inputs coupled to respective ones of the plurality of series connected unit delay elements.

9. The complementary output generator module according to claim 1, further comprising a rising event deadband time circuit for inhibiting the second output drive signal until after the rising event deadband time circuit has timed out.

10. The complementary output generator module according to claim 9, wherein the rising event deadband time circuit comprises:
a counter coupled to the clock source;
a comparator coupled to the counter; and
a deadband time register coupled to the comparator.

11. The complementary output generator module according to claim 9, wherein the rising event deadband time circuit comprises:
a plurality of series connected unit time delay elements; and
a multiplexer having inputs coupled to respective ones of the plurality of series connected unit delay elements.

12. The complementary output generator module according to claim 11, wherein each unit time delay element provides a fixed time delay.

13. The complementary output generator module according to claim 12, wherein the fixed time delay is about five nanoseconds.

14. The complementary output generator module according to claim 1, further comprising a falling event deadband time circuit for inhibiting the first output drive signal until after the falling event deadband time circuit has timed out.

15. The complementary output generator module according to claim 14, wherein the falling event deadband time circuit comprises:
a counter coupled to the clock source;
a comparator coupled to the counter; and
a deadband time register coupled to the comparator.

16. The complementary output generator module according to claim 14, wherein the falling event deadband time circuit comprises:
a plurality of series connected unit time delay elements; and
a multiplexer having inputs coupled to respective ones of the plurality of series connected unit delay elements.

17. The complementary output generator module according to claim 16, wherein each unit time delay element provides a fixed time delay.

18. The complementary output generator module according to claim 1, further comprising a plurality of output polarity reversing circuits, each one of the plurality of output polarity reversing circuits is coupled to a respective one of the plurality of outputs, wherein when a first logic level is applied to the output polarity reversing circuits the respective ones of the plurality of outputs provide a non-inverted output drive signal and when a second logic level is applied to the output polarity reversing circuits the respective ones of the plurality of outputs provide an inverted output drive signal.

19. The complementary output generator module according to claim 1, further comprising a plurality of output steering multiplexers, wherein the plurality of output steering multiplexers couples respective ones of the plurality of outputs to either a respective signal, a logic high, a logic low, or a high impedance.

20. The complementary output generator module according to claim 19, wherein the plurality of output steering multiplexers changes coupling of signals to the plurality of outputs substantially immediately.

21. The complementary output generator module according to claim 19, wherein the plurality of output steering multiplexers changes coupling of signals to the plurality of outputs in synchronization with a next rising event signal.

22. The complementary output generator module according to claim 1, further comprising a pulse width modulation (PWM) generator having an output coupled to the rising and falling event inputs.

23. The complementary output generator module according to claim 1, wherein the complementary output generator module is configured in a half-bridge mode.

24. The complementary output generator module according to claim 1, wherein the complementary output generator module is configured in a push-pull mode.

25. The complementary output generator module according to claim 1, wherein the complementary output generator module is configured in a forward full-bridge mode.

26. The complementary output generator module according to claim 1, wherein the complementary output generator module is configured in a reverse full-bridge mode.

27. The complementary output generator module according to claim 1, wherein the complementary output generator module is configured in a steering mode.

28. The complementary output generator module according to claim 1, wherein the complementary output generator module is configured in a synchronous steering mode.

29. A method for generating complementary waveforms, said method comprising the steps of:
selecting at least one rising event source from a plurality of rising event sources;
providing for blanking of subsequent at least one falling event within a programmable rising event blanking time period;
selecting between detection of rising event source edges or rising event source voltage levels for generating a rising event signal;
selecting at least one falling event source from a plurality of falling event sources;
providing for blanking of subsequent at least one rising event within a programmable falling event blanking time period;
selecting between detection of falling event source edges or falling event source voltage levels for generating a falling event signal;
asserting at least one first output upon detection of the at least one rising event until detection of the at least one falling event; and
asserting at least one second output upon detection of the at least one falling event until detection of a next at least one rising event.

30. The method according to claim 29, further comprising the step of providing for a rising event phase delay, wherein the rising event phase delay delays the rising event signal.

31. The method according to claim 29, further comprising the step of providing a falling event phase delay, wherein the falling event phase delay delays the falling event signal.

32. The method according to claim 31, wherein the step of providing the deadband time comprises the step of delaying assertion of the second output after the step of de-asserting the first output.

33. The method according to claim 29, further comprising the step of providing a deadband time between the steps of asserting the first output and asserting the second output.

34. The method according to claim 33, wherein the step of providing the deadband time comprises the step of delaying assertion of the first output after the step of de-asserting the second output.

35. The method according to claim 29, further comprising the step of forcing all of the outputs to predefined logic levels upon assertion of an auto-shutdown.

* * * * *